United States Patent [19]

Melton et al.

[11] Patent Number: 5,320,272
[45] Date of Patent: Jun. 14, 1994

[54] TIN-BISMUTH SOLDER CONNECTION HAVING IMPROVED HIGH TEMPERATURE PROPERTIES, AND PROCESS FOR FORMING SAME

[75] Inventors: Cynthia Melton, Bolingbrook; Harry Fuerhaupter, Lombard; George Demet, Lake Forest, all of Ill.

[73] Assignee: Motorola, Inc., Schaumburg, Ill.

[21] Appl. No.: 42,227

[22] Filed: Apr. 2, 1993

[51] Int. Cl.$^5$ .............................................. H05K 3/34
[52] U.S. Cl. ........................... 228/180.21; 228/262.61
[58] Field of Search ................ 228/123, 180.2, 263.18, 228/248, 180.21, 262.61, 193; 174/259; 437/209; 420/562

[56] References Cited

U.S. PATENT DOCUMENTS

| | | | |
|---|---|---|---|
| 4,636,073 | 1/1987 | Williams | 356/243 |
| 4,761,699 | 8/1988 | Ainslie et al. | 360/103 |
| 5,156,997 | 10/1992 | Kumar et al. | 437/183 |
| 5,186,383 | 2/1993 | Melton et al. | 228/254 |
| 5,221,038 | 6/1993 | Melton et al. | 228/197 |

OTHER PUBLICATIONS

American Society for Metals, "Soldering", *Welding, Braising and Soldering*, vol. 6, Metals Handbook, 9th Edition, 1983, pp. 1069 through 1076.

Murphy, Jim "*Tin-Bismuth Alloy Plating, a Fusible Low Temperature Etch Resist for High Aspect Ratio PC Boards*", presented at IPC Fall Meeting, Oct. 7, 12, 1990, San Diego, Calif.

Prints, A. et al., *Phase Diagrams of Terniary Gold Alloys* The Institute of Metals, London (1990).

*Primary Examiner*—Samuel M. Heinrich
*Attorney, Agent, or Firm*—Douglas D. Fekete

[57] ABSTRACT

In an electronic package, a solder connection for bonding faying surfaces is formed of tin-bismuth alloy comprising a tertiary metal, preferably gold or silver, in an amount effective to increase the melting temperature of the alloy and enhance mechanical properties of the connection at elevated temperatures typically encountered during operation. A process for forming the solder connection comprises applying a film of the tertiary metal onto at least one faying surface and thereafter applying tin-bismuth solder paste onto the film. Preferably, a plate of tin-bismuth alloy is first electroplated onto the faying surface, onto which the tertiary metal is plated. During heating to reflow the solder, the tertiary metal dissolves to produce a uniform liquid that forms the connection.

17 Claims, 1 Drawing Sheet

HARDNESS VS. TEMPERATURE

MELTING TEMPERATURE VS. GOLD CONTENT

TIN-BISMUTH SOLDER CONNECTION HAVING IMPROVED HIGH TEMPERATURE PROPERTIES, AND PROCESS FOR FORMING SAME

BACKGROUND OF THE INVENTION

This invention relates to a solder connection formed of a tin-bismuth solder alloy and, more particularly, to such solder alloy comprising a tertiary metal, preferably gold or silver, to enhance high temperature properties. In one aspect, this invention relates to a process for forming a solder connection by reflowing tin-bismuth solder paste, wherein the tertiary metal is deposited onto the faying surface and dissolves into the solder liquid during reflow to improve high temperature properties of the product connection.

In the manufacture of a microelectronic package, it is common practice to attach a component onto a printed circuit board or the like by surface mounting utilizing a solder connection formed from a solder paste. For this purpose, the board features a circuit trace that includes a solder-wettable bond pad that constitutes a first faying surface for the connection. Similarly, the component includes a second, solder-wettable faying surface, for example, a contact. The solder paste comprises particles of solder alloy dispersed in a vaporizable vehicle and containing an expendable organic binder. The paste is applied to the faying surface, after which the component is assembled with the second faying surface in contact with the deposit. The assembly is then heated to melt and reflow the solder alloy. Upon cooling, the solder alloy resolidifies and bonds to the faying surfaces to complete the connection. The solder connection not only physically attaches the component to the board, but also electrically connects the trace on the board and the contact of the component to conduct electrical current to or from the component for processing.

The circuit trace in the board is commonly formed of copper. In order to protect the copper surface from oxidation and thereby enhance wetting by the solder alloy, which wetting is essential to forming a strong solder bond, it is common practice to electroplate solder alloy onto the bond pad prior to applying the solder paste. During reflow, solder liquid from the plate and the paste interfuse to form a uniform connection.

Common solder is composed of tin-lead alloy. It has been proposed to form a lead-free solder connection composed of tin-bismuth alloy. However, tin-bismuth alloy in the form that is electroplated or is commercially available in paste exhibits poor mechanical properties at elevated temperatures of the type typically encountered by microelectronic packages during use. In particular, such solder alloys tend to become unacceptably soft at temperatures as low as 100° C. and exhibit a relatively low melting temperature, particularly in comparison to the common tin-lead solders.

SUMMARY OF THE INVENTION

This invention contemplates an electronic package that comprises a solder connection based upon tin-bismuth alloy and further containing a tertiary metal effective to increase melting temperature and improve mechanical properties at elevated temperatures within the range typically encountered by microelectronic packages. The tertiary metal is preferably silver or gold. It has been found that additions of gold or silver between about 1.0 and 2.2 weight percent are effective to significantly improve the desired high temperature properties of the connection.

In one aspect of this invention, a process is provided for forming a solder connection between a first faying surface and a second faying surface, for example, between a bond pad of a printed circuit board and a contact of a component. The method comprises applying a film of the tertiary metal to at least one faying surface and thereafter applying a deposit of solder paste onto the film. In a preferred embodiment, a plate of tin-bismuth solder alloy is first electrodeposited or otherwise applied to the first faying surface and coated with the tertiary metal. In any event, the solder paste comprises particles composed of tin-bismuth alloy. The second faying surface is assembled in contact with the solder paste, whereafter the assembly is heated to a temperature sufficient to melt the solder particles, as well as the tin-bismuth plate, if present. The tertiary metal dissolves to form a uniform liquid that wets the faying surfaces, extending continuously therebetween, and upon cooling, solidifies to form a solder connection bonding the faying surfaces and having enhanced high temperature properties.

DESCRIPTION OF THE DRAWINGS

The present invention will be further illustrated with reference to the accompanying drawings wherein.

Detailed Description of the Invention

Figure 1:
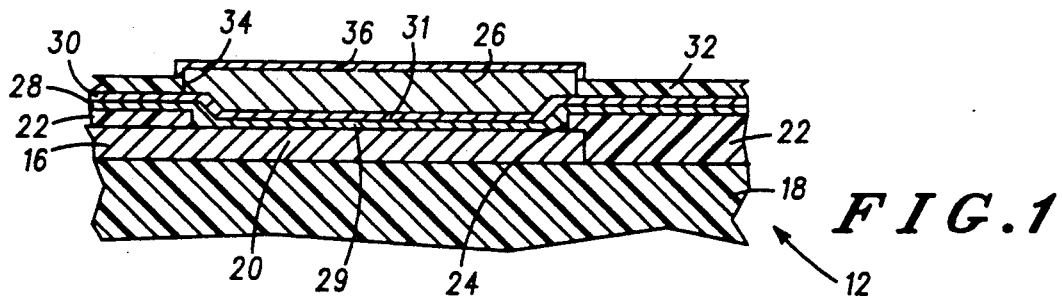
FIG. 1 is a cross-sectional view of a printed circuit board having an electroplated bond pad utilized in a preferred embodiment of this invention.
Figure 2:
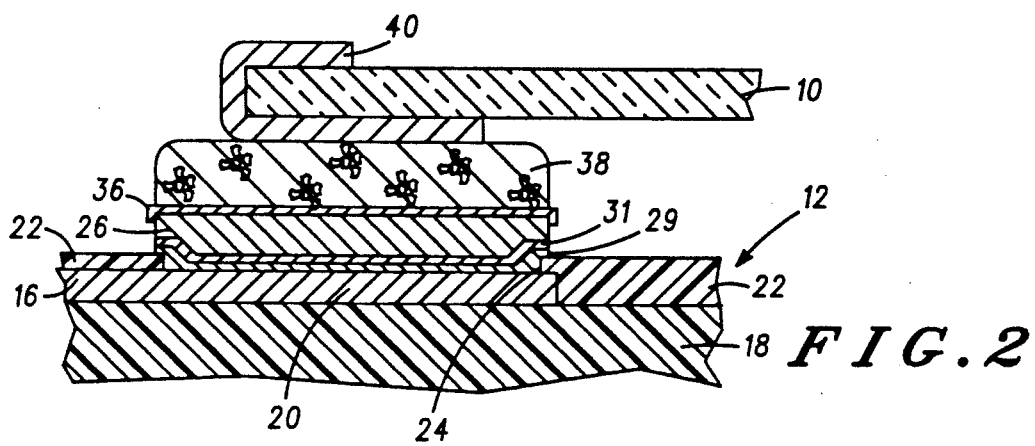
FIG. 2 is a cross-sectional view of an assembly comprising a printed circuit board and a component arranged for forming a solder connection in accordance with this invention.
Figure 3:
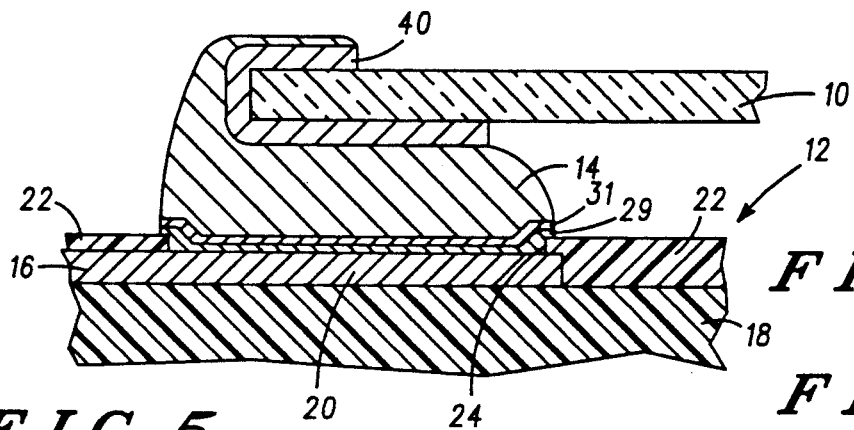
FIG. 3 is a cross-sectional view of the assembly in FIG. 2 following solder reflow operations to connect the component to the printed circuit board.

In a preferred embodiment, referring to the FIGS. 1 through 3, this invention is employed to attach a discrete component 10, such as a resistor or the like, to a printed circuit board 12 by a solder connection 14 in FIG. 3 composed of tin-bismuth alloy containing gold in an amount effective to enhance high temperature properties of the connection.

Referring to FIG. 1, printed circuit board 12 comprises a metallic copper trace 16 affixed to a dielectric substrate 18 of the type referred to as an FR4 card and composed of an epoxy resin and glass fiber laminate. Trace 16 includes a surface mount pad 20 that is a site for attaching component 10. Board 12 is covered by a solder mask 22 formed of an epoxy-base or other suitable polymeric resin having a solder-nonwettable surface. Mask 22 defines an opening 24 at which pad 20 is exposed. In addition to providing a surface that is not wettable by solder alloy to inhibit the spread of solder during subsequent reflow operations and thereby confine the molten solder to the site of the connection, mask 22 also provides a generally planar surface to facilitate subsequent processing operations and protects trace 16 apart from pad 20 during the several steps leading up to and including the electroplating of metal for making the connection in accordance with this embodiment.

In preparation for electroplating, printed circuit board 12 is coated with a chromium layer 28 and a copper layer 30. Pad 20 is first cleaned to remove surface oxidation by immersing board 12 in a aqueous dilute phosphoric acid solution, rinsing and drying at 100° C. The board is placed in a sputtering machine and cleaned by ion milling in argon gas at a pressure between 1 and 20 millitorr for about 4 minutes. Thereafter, chromium is sputtered onto the board to form layer 28 having a thickness of about 80 nanometers. Chromium layer 28 includes a region 29 deposited directly onto pad 20. Copper is sputtered onto chromium layer 28 to form layer 30 having a thickness of about 500 nanometers and including a region 31 bonded to chromium region 29 overlying pad 20. Copper layer 30 provides a conductive path for conveniently and uniformly distributing electroplating current, whereas chromium film 28 enhances adhesion of the sputtered copper to mask 22 to facilitate handling.

Following deposition of copper film 30, a photoresist mask 32 is applied and developed to define an opening 34 for exposing the copper at region 31. Mask 32 is suitably formed of a photoimageable polymeric material and provides an electrically insulative covering on copper layer 30 to confine electrodeposition to region 31.

Board 12 with photoresist mask 32 is immersed in an aqueous tin-bismuth electroplating solution. A suitable plating solution contains between about 6 and 18 grams per liter bismuth, added as bismuth methane sulfonate, Bi(CH$_3$SO$_3$)$_3$; between about 4 and 8 grams per liter tin, added as tin methane sulfonate, Sn(CH$_3$SO$_3$)$_2$; and between about 100 and 150 grams per liter methane sulfonic acid solution, CH$_3$SO$_3$H; in water, together with minor additions of methanol, an organic surfactant and other compounds to promote plating. The bismuth methane sulfonate, tin methane sulfonate and methane sulfonic acid are commercially available as concentrated solutions. Board 12 is immersed in the solution at ambient temperature, spaced apart from a suitable counterelectrode. A suitable counterelectrode is formed of metallic tin. Alternately, the counterelectrode may be formed of tin-bismuth alloy to replenish bismuth as well as tin during extended operation, or may be an inert electrode formed, for example, of platinum-plated titanium. An electrical current of about 15 to 30 milliamperes per square centimeter is applied to cathodically bias layer 30 to concurrently reduce tin and bismuth ions to their respective metals and thereby deposit tin-bismuth alloy onto region 31. Plating is carried out for a time sufficient form a deposit 26 having a thickness of about 25 microns. The resulting deposit 26 is composed of between about 48 and 68 weight percent bismuth and the balance tin.

Following tin-bismuth plating, the board is immersed in an aqueous potassium gold cyanide solution, and copper layer 30 is again cathodically biased to deposit a film 36 of gold metal onto deposit 26. A suitable gold plating solution contains between about 3 and 8 grams per liter gold, added as potassium gold cyanide, KAu(CN)$_2$, in water and has a pH between about 5.5 and 7.0. The solution may include potassium and ammonium salts to improve conductivity and provide pH buffering, and lead acetate as a grain refiner. An electrical current of between about 0.5 and 2.5 milliamperes per square centimeter is applied to layer 30 to cathodically bias deposit 26 to reduce gold ions to metallic gold and deposit film 36 having a thickness of about 0.25 micron.

Following electroplating, the board is immersed in a photoresist stripping solution to remove photoresist mask 32, thereby exposing the copper layer 30 about deposit 26. The board is immersed in an aqueous copper-etching solution comprising cupric chloride to remove the exposed copper and is thereafter immersed in an aqueous chromium-etching solution comprising alkaline ferricyanide to remove the exposed chromium layer 28. It is pointed out that etching is limited to metal overlying solder mask 22 about pad 20 by tin-bismuth deposit 26 and the gold film 36, which are resistant to the etching solutions and protect the underlying regions 29 and 31 that attach deposit 26 to pad 20. The resulting plated board is shown in FIG. 2 and includes solder deposit 26 and gold coating 36. Following etching, solder mask 22 is revealed and provides solder-nonwettable surface to inhibit the spread of solder during subsequent reflow. It is a significant feature of this embodiment that deposit 26 does not require reflow at this stage of processing, that is, prior to assembly with component 10. Rather, it is found that deposit 26, in the as-plated and unfused condition, is suitably bonded to permit handling, in contrast to processes that utilize electroplated tin-lead solder and require fusion to secure the solder plate.

Referring to FIG. 2, a solder paste is applied to gold film 36 by screen printing to form a solder deposit 38 having a thickness between about 100 and 120 microns. The paste preferably comprises powder consisting of tin-bismuth solder alloy having a near eutectic composition of about 60 weight percent bismuth and the balance tin. The tin-bismuth powder is sized between −200 and +325 mesh and is dispersed in a solvent composed of high-boiling alcohols and glycol and containing a flux comprising white rosin compound. The paste also includes an expendable organic binder, suitably ethyl cellulose compound, effective to bond the powder into a cohesive deposit.

Following application of the solder paste, board 12 and component 10 are assembled as shown in FIG. 2. Component 10 comprises a contact 40 formed of palladium-silver alloy, which constitutes one faying surface for the connection, whereas the other faying surface in this embodiment is provided by copper region 31 bonded to pad 20. Contact 40 may include a thin tin flash to enhance wetting during solder reflow. The assembly is heated to a temperature greater than 140° C., and preferably greater than 160° C., to reflow the solder alloy. During the initial stages of heating, the residual solvent and organic binder in deposit 38 are vaporized. As the assembly is heated to above about 138.5° C., the eutectic melting temperature, the solder particles melt and coalesce to produce a liquid phase. Concurrently, the solder alloy of deposit 26 commences melting and also forms a liquid. Gold from film 36 dissolves into the adjacent liquid derived from the solder deposits. The result is a uniform liquid that wets copper region 31 and contact 40 and, upon cooling, solidifies to produce connection 14 in FIG. 3 that bonds to region 31 and contact 40 and extends continuously therebetween to attach component 10 to board 12 and also to electrically connect the pad and the contact. Connection 14 is composed substantially of tin and bismuth derived from the solder alloy of deposits 26 and 38 and contains gold in an amount up to about 2.2 percent, which gold is derived from film 36.

Figure 4:
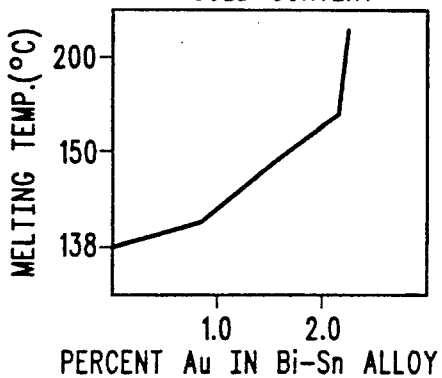
FIG. 4 is a graph showing melting temperature as a function of gold content in tin-bismuth solder alloy.

FIG. 4 is a graph showing melting temperature as a function of gold concentration in alloy composed of 58 weight percent bismuth and the balance tin. As can be seen, concentrations of gold of as little as 1 weight percent significantly increase the melting temperature of the alloy. Concentration greater than about 2.2 weight percent require high reflow temperatures above about 210° C. that tend to damage other features typically found in electronic packages. Also, at higher gold concentrations, the formation of tin-gold becomes significant and tends to diminish the mechanical properties of the connection. A preferred gold concentration in the product connection is between about 1.0 and 2.2 weight percent gold and may be readily obtained by controlling the thickness of the plated gold film relative to the mass of the tin-bismuth alloy that is plated or deposited as solder paste in the described embodiment.

Figure 5:
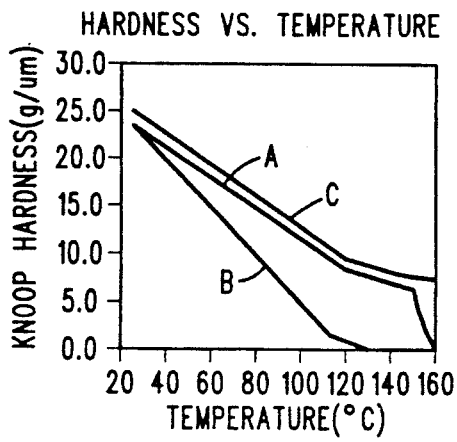
FIG. 5 is a graph showing Knoop hardness as a function of temperature for several solder alloys, including gold-containing tin-bismuth alloy in accordance with this invention.

FIG. 5 shows a plot of Knoop hardness in grams per micron as a function of temperature. Curve A indicates Knoop hardness for an alloy comprising about 2.0 weight percent gold, 58 weight percent bismuth and the balance tin. For purposes of comparison, curve B shows hardness for a comparable bismuth-tin alloy without gold, whereas curve C represents a standard tin-lead solder alloy composed of about 2 weight percent silver, about 36 weight percent lead and the balance tin. As can be seen, the gold addition substantially increases the hardness of bismuth-tin solder alloys at elevated temperatures and produces a hardness comparable to tin-lead alloy within the range of about 110° C. to 150° C. In general, hardness is believed to indicate increased strength, so that the gold additions in accordance with this invention result in stronger, more durable connections that are better able to withstand temperature excursions of the type experienced by microelectronic packages during use.

Although in the described embodiment, the solder connection comprises gold, a similar increase in the melting temperature of tin-bismuth alloy is obtained utilizing silver additions. Accordingly, silver may be suitably substituted to enhance the high temperature properties of solder connections formed of alloys of tin and bismuth.

Therefore, this invention provides a solder connection formed of a ternary alloy that is predominantly tin and bismuth and containing a third metal, referred to as a tertiary metal, to increase the melting temperature and enhance hardness and other metallurgical properties. Tin and bismuth form a eutectic composition composed of about 42 weight percent tin and 58 weight percent bismuth and having a melting temperature of about 138.5° C. In general, tin alloys containing less than 30 weight percent or greater than 70 weight percent bismuth require relatively high reflow temperatures that tend to damage other common components typically found in a microelectronic package. Thus, it is desired to form the plated deposit, that is, deposit 26 in the described embodiment, and the solder paste deposit, that is, deposit 38, of tin alloy containing between about 30 and 70 weight percent bismuth. Preferred alloy contains between about 48 and 68 weight percent bismuth. Optionally, the initial alloy may include small amounts, typically less than 4 percent, of other alloying agents to enhance mechanical properties. Such optional agents may include gold or silver present in the initial alloy provided that the resulting concentration in the product connection following reflow is within the range effective to enhance the desired high temperature properties. However, as in the described process, it is preferred that the initial plate and paste particles be substantially free of the coating metal to enhance dissolution of metal into the liquid. Preferably, the alloy contains no lead except as might be present as impurity.

In the described embodiment, the process was adapted for a printed circuit board having a predefined trace by depositing a copper layer across the board to conduct current for electroplating. Alternately, the solder plate and the tertiary metal film may be deposited onto the bond pad by sputtering or other suitable processes. Moreover, in the described embodiment, the tin-bismuth plate on the bond pad serves as a mask to protect underlying copper during etching. Commercial substrates for printed circuit boards comprise a copper layer uniformly covering the surface of the epoxy laminate card, which layer is subsequently patterned to define the trace. In an alternate embodiment of the invention, a photo-resist mask is applied to the copper layer and developed to define openings in a pattern corresponding to the desired trace, including the bond pad and sections running from the pad. Tin-bismuth alloy is electroplated onto the exposed copper. The photoresist mask is removed, exposing the copper about the plated trace, which is removed utilizing a copper-etching solution, whereas the tin-bismuth plate protects the underlying copper to form the trace. Thereafter, a gold or silver film and tin-bismuth solder paste are applied to the pad, after which the board is assembled with the component and heated to reflow the tin-bismuth solder to form the connection. The resulting connection includes tin-bismuth alloy derived from the solder plate and the solder paste and also contains gold in accordance with this invention to enhance high temperature properties.

In addition to forming a connection for mounting a discrete component to a printed circuit board as in the described embodiment, this invention may be utilized to form lead-free joints in other applications. Although copper and platinum-silver alloy were selected for the faying surfaces in the described embodiment, the faying surfaces may be formed of nickel or any other metal that is solder-wettable so as to produce a strong solder bond. Still further, this invention may be readily adapted to form solder bump interconnections between a substrate, such as a printed circuit board or a ceramic chip carrier, and a bond pad located on an integrated circuit chip.

While this invention has been described in certain embodiments thereof, it is not intended that it be limited to the above description, but rather only to the extent set forth in the claims that follow.

The embodiments of the invention in which an exclusive property or privilege is claimed are defined as follows:

1. In an electronic package comprising a first faying surface, second faying surface and a solder connection bonding the first faying surface and the second faying surface, the improvement wherein the solder connection is formed of a solder alloy composed predominantly of bismuth and tin and further comprising a metal selected from the group consisting of gold and silver in an amount between about 1.0 and 2.2 weight percent and effective to increase the melting temperature of the interconnection.

2. An electronic package in accordance with claim 1 wherein the solder alloy comprises between about 30 and 70 weight percent bismuth.

3. An electronic package in accordance with claim 1 wherein the solder alloy consists essentially of between about 48 and 68 weight percent bismuth, between about 1.0 and 2.2 weight percent gold, and the balance tin.

4. In an electronic package comprising an electronic component mounted to a printed circuit board by a solder connection, said printed circuit board comprising a bond pad formed of copper metal, said component comprising a contact formed of a solder-wettable metal, said solder connection bonding of the bond pad and the contact to attach the electronic component to the printed circuit board and to electrically connect the bond pad and the contact, the improvement comprising a solder connection formed of a solder alloy substantially composed of between about 30 and 70 weight percent bismuth, between about 1.0 and 2.2 weight percent metal selected from the group consisting of gold and silver, and the balance tin.

5. An electronic package in accordance with claim 4 wherein the solder alloy consists essentially of between about 48 and 68 weight percent bismuth, between about 1.0 and 2.2 weight percent gold and the balance tin.

6. A process for solder bonding a first faying surface and a second faying surface, said process comprising
applying to at least one faying surface a film composed of a metal selected from the group consisting of gold and silver,
applying a solder paste onto the film to form a particulate deposit formed predominantly of solder particles of an alloy composed substantially of tin and bismuth,
assembling the second faying surface in contact with the particulate deposit to form an assembly,
heating the assembly to a temperature sufficient to melt and the particulate deposit to form a liquid that wets the faying surfaces, whereupon the metal from the film dissolves into the liquid, and
cooling to solidify the liquid to form a solder connection bonded to the faying surfaces.

7. A process in accordance with claim 6 wherein the solder particles comprise between about 30 and 70 weight percent bismuth and the balance tin.

8. A process in accordance with claim 6 wherein the solder particles are composed of between about 48 and 68 weight percent bismuth and tin.

9. A process in accordance with claim 6 further comprising applying to the first faying surface a plate formed of tin-bismuth alloy and thereafter depositing the film onto the plate.

10. A process in accordance with claim 6 wherein the solder connection is composed substantially of between about 48 and 68 weight percent bismuth, between about 1.0 and 2.2 weight percent gold and the balance tin.

11. A process for solder bonding a first faying surface and a second faying surface, said process comprising:
applying to the first faying surface a solder layer formed of an alloy composed substantially of tin and bismuth,
coating the solder layer with a film composed of a metal selected from the group consisting of gold and silver,
applying a solder paste onto the film to form a particulate deposit formed predominantly of solder particles of an alloy composed of substantially of tin and bismuth,
assembling the second faying surface in contact with the particulate deposit to form an assembly,
heating the assembly to a temperature sufficient to melt the solder layer and the particulate deposit to form a liquid that wets the faying surfaces, whereupon the metal from the film dissolves into the liquid, and
cooling to solidify the liquid to form a solder connection bonding to the faying surfaces.

12. A process in accordance with claim 11 wherein the step of applying the solder layer comprises electroplating the alloy onto the first faying surface.

13. A process in accordance with claim 11 wherein the solder layer and the solder particles are composed of solder alloy comprising between about 30 and 70 weight percent bismuth and the balance substantially tin.

14. A process in accordance with claim 11 wherein the solder layer is composed of a solder alloy comprising between about 48 and 68 percent bismuth and the balance substantially tin.

15. A process in accordance with claim 11 wherein the step of coating the solder layer comprises depositing the metal by electroplating.

16. A process in accordance with claim 11 wherein the assembly is heated to a temperature greater than about 140° C.

17. A process for mounting a component onto a printed circuit board, said component comprising a contact formed of a solder-wettable metal, said printed circuit board comprising a bond pad formed of a solder-wettable metal, said process comprising:
electrodepositing a plate onto the bond pad, said plate being formed of a solder alloy composed of between about 30 and 70 weight percent bismuth and the balance substantially tin,
electrodepositing a film onto the plate, said film being composed of a tertiary metal selected from the group consisting of gold and silver,
applying a paste onto the film to form a deposit comprising solder particles formed of an alloy composed of between about 30 and 70 weight percent bismuth and the balance substantially tin,
assembling the component and the substrate to form an assembly such that the contact of the component is in contact with said deposit,
heating the assembly to a temperature sufficient to melt the plate and the deposit and to dissolve the coating to form a liquid that wets the bond pad and the contact and extends continuously therebetween, and
cooling to solidify the liquid to form a solder connection bonding the contact and the bond pad and containing between about 1.0 and 2.2 weight percent tertiary metal to enhance high temperature properties.

* * * * *

UNITED STATES PATENT AND TRADEMARK OFFICE
CERTIFICATE OF CORRECTION

PATENT NO. : 5,320,272 Page 1 of 1
APPLICATION NO. : 08/042227
DATED : April 2, 1993
INVENTOR(S) : Cynthia Melton et al.

It is certified that error appears in the above-identified patent and that said Letters Patent is hereby corrected as shown below:

In Column 7, Line 40, Claim No. 6:

Delete the word "and" following the word "melt".

Signed and Sealed this

Fifth Day of June, 2007

JON W. DUDAS
*Director of the United States Patent and Trademark Office*

UNITED STATES PATENT AND TRADEMARK OFFICE
CERTIFICATE OF CORRECTION

| | |
|---|---|
| PATENT NO. | : 5,320,272 |
| APPLICATION NO. | : 08/042227 |
| DATED | : June 14, 1994 |
| INVENTOR(S) | : Cynthia Melton et al. |

It is certified that error appears in the above-identified patent and that said Letters Patent is hereby corrected as shown below:

In Column 7, Line 40, Claim No. 6:

Delete the word "and" following the word "melt".

This certificate supersedes the Certificate of Correction issued June 5, 2007.

Signed and Sealed this

Fifth Day of February, 2008

JON W. DUDAS
*Director of the United States Patent and Trademark Office*